United States Patent [19]
Dathe

[11] Patent Number: 5,268,589
[45] Date of Patent: Dec. 7, 1993

[54] SEMICONDUCTOR CHIP HAVING AT LEAST ONE ELECTRICAL RESISTOR MEANS

[75] Inventor: Joachim Dathe, Munich, Fed. Rep. of Germany

[73] Assignee: Siemens Aktiengesellschaft, Munich, Fed. Rep. of Germany

[21] Appl. No.: 974,318

[22] Filed: Nov. 10, 1992

Related U.S. Application Data

[63] Continuation of Ser. No. 726,350, Jul. 5, 1991, abandoned.

[30] Foreign Application Priority Data

Sep. 28, 1990 [EP] European Pat. Off. ........ 90118727.8

[51] Int. Cl.⁵ ..................... H01L 29/72; H01L 27/02
[52] U.S. Cl. ................................... 257/577; 257/536; 257/539; 257/587
[58] Field of Search ............... 357/23.13, 34, 51, 53, 357/46; 257/358, 359, 362, 363, 536, 539, 541, 542, 543, 577, 585, 587

[56] References Cited

U.S. PATENT DOCUMENTS

| | | | |
|---|---|---|---|
| 3,787,717 | 1/1974 | Fischer et al. | 357/23.13 |
| 4,261,002 | 4/1981 | Roger | 357/46 |
| 4,312,011 | 1/1982 | Kanbayashi | 357/53 |
| 4,427,265 | 11/1983 | Murkland et al. | 257/560 |
| 5,021,856 | 6/1991 | Wheaton | 357/40 |
| 5,113,230 | 5/1992 | Kinoshita | 357/53 |

FOREIGN PATENT DOCUMENTS 2258058 8/1975 France .

OTHER PUBLICATIONS

Patent Abstracts of Japan, vol. 9, No. 19 (E-292), Jan. 25, 1985, Michio Komatsu "Semiconductor Integrated Circuit".

*Primary Examiner*—J. Carroll
*Attorney, Agent, or Firm*—Hill, Steadman & Simpson

[57] ABSTRACT

A semiconductor chip has at least one electrical resistor means, at least one semiconductor component arranged in the semiconductor chip, and at least one metallization for the semiconductor component on the semiconductor chip. At least one resistor means is at least partially arranged under the metallization. This permits a space requirement for the resistor means on the semiconductor chip to be reduced.

4 Claims, 1 Drawing Sheet

SEMICONDUCTOR CHIP HAVING AT LEAST ONE ELECTRICAL RESISTOR MEANS

This is a continuation of application Ser. No. 07/726,350, filed Jul. 5, 1991, abandoned.

BACKGROUND OF THE INVENTION

The invention is directed to a semiconductor chip having at least one electrical resistor means associated with a semiconductor component integrated in the semiconductor chip.

The purpose of the invention is a space-saving design of electrical resistors for semiconductor components.

The invention can be employed for a semiconductor component having resistor networks. The invention is particularly suited for silicon planar components.

FIG. 1 shows a plan view onto a bipolar transistor 1 of the prior art having two resistors 2 and 3. The resistors 2, 3 connected to the active semiconductor component 1, for example to a bipolar transistor, are thereby arranged next to this semiconductor component 1, as shown by the example of a bipolar transistor of FIG. 1 having the two electrical resistors 2, 3. The resistor 2 is a base drop resistor and has a value of resistance of 50 k ohms or below. The resistor 3 is an emitter-base parallel resistor and likewise has a value of resistance of 50 k ohms or below. The semiconductor component 1 has an emitter terminal metallization (emitter pad) 4 and a base terminal metallization (base pad) 5. The considerable space requirement for the two meander-like resistors 2, 3 is obvious in FIG. 1. The semiconductor chip that comprises the semiconductor component 1 and the resistors 2, 3 requires nearly twice the chip area as a semiconductor chip that has only the individual transistor 1.

SUMMARY OF THE INVENTION

An object of the present invention is to specify a semiconductor chip of the type initially cited which enables a reduction of the space requirement on the semiconductor chip for resistor means, particularly for resistor means having high ohmic values.

This object is inventively achieved by a semiconductor device wherein a semiconductor chip is provided having at least one semiconductor component integrated in the chip. At least one metallization is connected to the semiconductor component, and at least one resistor is arranged at least partially under the metallization.

In order to reduce the considerable space requirement for a semiconductor chip which, in addition to comprising at least one semiconductor component also has at least one resistor means, the at least one resistor means is at least partially arranged under a terminal metallization or pad. The resistor means can be integrated in the semiconductor chip. The resistor means, however, can also be applied onto the surface of the semiconductor chip, for example by vapor-deposition or on the basis of some other technique with which a person skilled in the art is familiar.

The chip area of a semiconductor chip of the invention can, given the same electrically active area, amount, for example, to 40% of the chip area required in the prior art.

DESCRIPTION OF THE PREFERRED EMBODIMENTS

Figure 3:
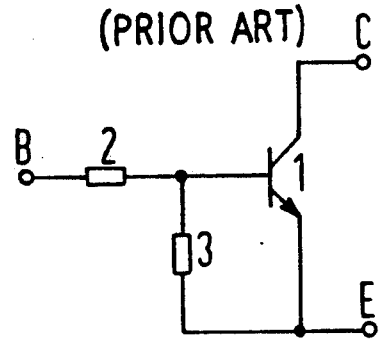
FIG. 3 shows an equivalent circuit diagram for the arrangement of FIG. 2.
Figure 2:
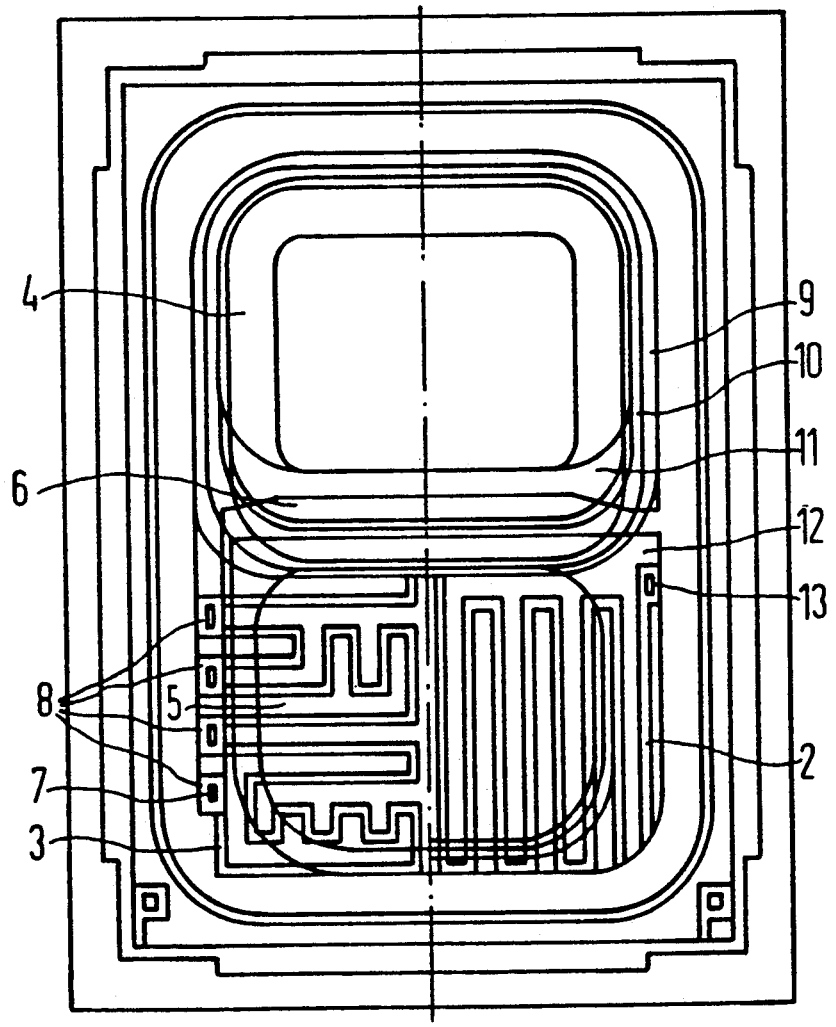
FIG. 2 shows a plan view onto a semiconductor chip of the invention.

FIG. 2 shows an exemplary embodiment on the basis of a silicon planar transistor having a resistor network conforming to an equivalent circuit diagram of FIG. 3.

Figure 1:
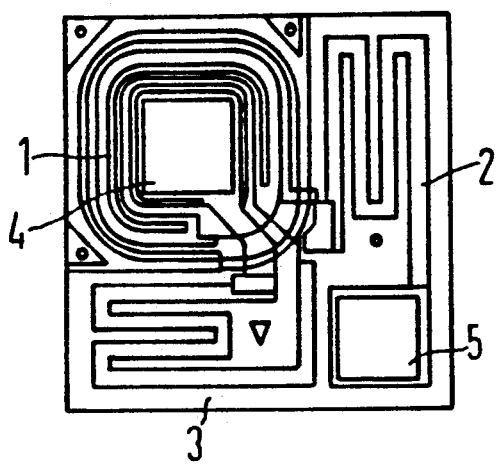
FIG. 1 shows a plan view onto a semiconductor chip of the prior art.

In order to reduce the considerable space requirement for the electrical resistors 2, 3 provided in the exemplary embodiment of FIG. 2 and for that of FIG. 1 conforming to the known example, these resistor means 2, 3 in the exemplary embodiment of FIG. 2 are at least partially arranged under the base metallization 12.

Given the same electrically active area as in the example of FIG. 1, the chip area of the semiconductor chip of FIG. 3 amounts to only 40% of the chip area required in the semiconductor chip of FIG. 1 (FIGS. 1 and 2 are drawn to different scales).

The silicon planar transistor integrated in the semiconductor chip of FIG. 2 has an approximately quadratic emitter diffusion region 6 in a base diffusion well 9 shown in dark in FIG. 2, and shortened downwardly in FIG. 2.

The emitter metallization 11 is situated in the emitter diffusion region 6, whereas the base metallization 12 is pulled out beyond the base well 9 alongside and laterally adjacent to active regions of the transistor onto the insulating layer present on the semiconductor chip. The insulation layer can be formed of a layer format of silicon dioxide and silicon nitride. The resistors 2, 3 are arranged at least partially under the base metallization 12. The resistors 2, 3 can be manufactured in common with the base well 9. The resistors 2, 3 can be manufactured by implantation, with possible after-diffusion following thereupon. An oxidation can subsequently occur in order to produce an insulation layer.

For manufacturing a 50 k ohm resistor, 250 squares are joined to one another given a base layer resistance of 200 ohms/square. Given an edge length of 4 μm and a strip spacing of 8 μm in the meander-like resistors 2, 3, this produces a space requirement of 120×190 μ² for the two resistors 2, 3 each having 50 k ohms, i.e. for a total of 100 k ohms. This corresponds to the area for modern bond pads, including the off-pad bonding.

At the right, FIG. 2 shows a simple meander design for a base dropping resistor 2 of 47 k ohms, whereas a meander design for the emitter-base parallel resistor 3 is designed at the left such that, given the same meander-like resistor for the resistor 3, four taps 8 for values of resistance are possible at 4.7 k ohms, at 10 k ohms, at 22 k ohms, and at 47 k ohms. By opening the corresponding contact window in the photolithography step which was implemented for opening the contact windows, the desired value of resistance can be selected from these four taps 8 and can thus be set for the respective, specific semiconductor chip. The remaining part of the resistance 3 which is not required can be shorted.

The same design having various taps 8 can also be employed for the base dropping resistor 2. A total of 2×4 different values of resistance for the resistors 2, 3 can be produced in different combinations in this way in the exemplary embodiment by changing the mask for only one level. The masks for the other levels can thus remain unaltered.

Further modifications can be produced by modifying the base layer resistance, by auxiliary implantation in the resistor area, or by a different geometrical design of the meander-like strips or of the resistor strips (different edge length, different spacings).

Given, for example, a PNP version of the semiconductor component, a n+ contact diffusion can be introduced in the base zone around the emitter zone. In an NPN version of the semiconductor component, correspondingly a p+-diffusion into the base zone can be introduced around the emitter zone.

A semiconductor chip of FIG. 2 has a base terminal diffusion 10, a terminal 13 to the base metallization 12 from the base dropping resistor 2, an emitter bond pad 4, a base bond pad 5, and a terminal emitter metallization 7.

Known semiconductor components other than bipolar transistors, for example diodes, other transistors, tetrodes, etc., can also be used as semiconductor components.

Resistor means can also be arranged under more than one terminal metallization. Resistor means can also be arranged under other metallizations for the electrical connection to a semiconductor component, for example under the emitter metallization or metallizations that are required for other semiconductor components, for example, under a gate metallization.

Although various minor changes and modifications might be proposed by those skilled in the art, it will be understood that I wish to include within the claims of the patent warranted hereon all such changes and modifications as reasonably come within my contribution to the art.

I claim as my invention:

1. A semiconductor device, comprising:
   a semiconductor chip;
   a bipolar transistor integrated in the semiconductor chip;
   a metallization as a base terminal pad directly connected to a base region of the bipolar transistor, and an emitter terminal pad connected to an emitter region of the bipolar transistor;
   a base dropping resistor having one end connected to a terminal and an opposite end connected to said base pad;
   an emitter-base resistor connected between said emitter terminal pad and said base terminal pad; and
   both said base dropping resistor and said emitter-base resistor each comprising a meander-like resistor both of which are arranged at least partially under but insulated from said base terminal pad.

2. A semiconductor device according to claim 1 wherein said base terminal pad is alongside and laterally adjacent to active regions of said bipolar transistor.

3. A semiconductor device according to claim 1 wherein the only components on said semiconductor chip are said bipolar transistor, said base dropping resistor, and said emitter-base resistor.

4. A semiconductor device, comprising:
   a semiconductor chip;
   a bipolar transistor integrated in the semiconductor chip;
   a metallization as a base terminal pad directly connected to a base region of the bipolar transistor, and an emitter terminal pad connected to an emitter region of the bipolar transistor;
   a base dropping resistor having one end connected to a terminal and an opposite end connected to said base pad;
   an emitter-base resistor connected between said emitter terminal pad and said base terminal pad;
   both said base dropping resistor and said emitter-base resistor each comprising a meander-like resistor both of which are arranged at least partially under but insulated from said base terminal pad;
   said base terminal pad being alongside and laterally adjacent to active regions of said bipolar transistor; and
   the only components on said semiconductor chip being said bipolar transistor, said base dropping resistor, and said emitter-base resistor.

* * * * *